US012713953B2

(12) United States Patent
Mayukh et al.

(10) Patent No.: US 12,713,953 B2
(45) Date of Patent: Aug. 18, 2026

(54) HYBRID SUBSTRATES AND MANUFACTURING METHODS THEREOF

(71) Applicant: Avago Technologies International Sales Pte. Limited, Singapore (SG)

(72) Inventors: Mayank Mayukh, Fort Collins, CO (US); Shrikara Prabhu Tendel, Singapore (SG); Jayanthi Pallinti, Los Gatos, CA (US); Gregory Dix, Fort Collins, CO (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 374 days.

(21) Appl. No.: 18/496,645

(22) Filed: Oct. 27, 2023

(65) Prior Publication Data

US 2025/0046690 A1 Feb. 6, 2025

Related U.S. Application Data

(60) Provisional application No. 63/517,747, filed on Aug. 4, 2023.

(51) Int. Cl.
*H10W 70/685* (2026.01)
*H10W 70/05* (2026.01)
(Continued)

(52) U.S. Cl.
CPC ......... *H10W 70/685* (2026.01); *H10W 70/05* (2026.01); *H10W 70/095* (2026.01); *H10W 70/635* (2026.01); *H10W 90/724* (2026.01)

(58) Field of Classification Search
CPC ......... H01L 23/49827; H01L 23/49822; H01L 21/486; H01L 21/4857; H01L 23/15; H01L 23/562; H01L 23/5385; H01L 23/5383; H01L 24/20; H01L 24/13; H01L 23/5386; H01L 23/49894; H01L 24/19; H01L 25/0652; H01L 25/0655; H01L 25/50; H01L 23/49816; H01L 23/5384; H01L 25/18; H01L 2224/16225;
(Continued)

(56) References Cited

U.S. PATENT DOCUMENTS

2001/0008309 A1* 7/2001 Iijima ..................... H01L 24/12 257/782
2006/0163740 A1* 7/2006 Ohno ..................... H05K 1/114 174/257

(Continued)

OTHER PUBLICATIONS

European Patent Office, Extended Search Report, Application No. 24191631.1, Dec. 23, 2024, 9 pages.

*Primary Examiner* — Mouloucoulaye Inoussa
(74) *Attorney, Agent, or Firm* — Quarles & Brady LLP

(57) ABSTRACT

The subject technology is directed to semiconductor devices and manufacturing methods. In various embodiments, the subject technology provides a semiconductor device, which comprises a first circuit characterized by a first coefficient of thermal expansion (CTE) and a substrate characterized by a second CTE. A ratio of the first CTE to the second CTE is greater than or equal to 3:5, which ensures harmonious thermal behavior, leading to improved yield and reduced warpage. In some implementations, one or more circuit elements may be embedded in the substrate. There are other embodiments as well.

20 Claims, 3 Drawing Sheets

(51) Int. Cl.
*H10W 70/63* (2026.01)
*H10W 90/00* (2026.01)

(58) Field of Classification Search
CPC ....... H01L 2924/0002; H01L 2924/181; H01L 2924/19105; H01L 2224/0401; H01L 2224/04105; H01L 2224/0557; H01L 2224/0603; H01L 2224/06181; H01L 2224/12105; H01L 2224/81203; H01L 2224/81444; H01L 2224/81464; H01L 2224/81815; H01L 2224/92125; H01L 2224/92224; H01L 2224/92244; H05K 1/111; H05K 1/14; H05K 3/4644; H05K 1/0284; H05K 1/0298; H05K 1/185; H05K 3/4602; H05K 3/4694
See application file for complete search history.

(56) References Cited

U.S. PATENT DOCUMENTS

2006/0202322 A1* 9/2006 Kariya ................. H05K 1/0271 257/701
2011/0080713 A1 4/2011 Sunohara
2011/0314666 A1* 12/2011 Harazono ............ H05K 3/4644 216/13
2012/0049368 A1* 3/2012 Tanaka .............. H01L 23/49822 257/774
2012/0068359 A1* 3/2012 Mori ................... H01L 23/5389 257/774
2012/0246924 A1* 10/2012 Hibino .............. H01L 23/49827 29/829
2012/0312590 A1* 12/2012 Maeda ................. H05K 1/0269 29/846
2013/0062108 A1* 3/2013 Kondo ................... H05K 3/387 977/932
2013/0093097 A1 4/2013 Yu et al.
2014/0311771 A1* 10/2014 Shimizu .............. H01L 23/5383 174/251
2015/0155218 A1* 6/2015 Hung ...................... H01L 23/36 257/713
2015/0179560 A1* 6/2015 Arisaka ............. H01L 23/49838 257/777
2015/0245478 A1* 8/2015 Miyazawa ............... C25D 5/10 174/257
2015/0245486 A1* 8/2015 Shin .................... H01L 23/3677 174/251
2015/0357276 A1* 12/2015 Shimizu ............ H01L 23/49838 361/783
2016/0057863 A1* 2/2016 Kyozuka ............... H01L 21/486 361/764
2016/0172287 A1* 6/2016 Arisaka ............. H01L 23/49822 257/774
2017/0018492 A1* 1/2017 Imayoshi .......... H01L 23/49827
2019/0333837 A1* 10/2019 Kang .................. H01L 23/3735
2019/0385989 A1* 12/2019 Yu ......................... H01L 25/105
2020/0006214 A1* 1/2020 Tsai ...................... H01L 21/486
2020/0043908 A1* 2/2020 Chung .................... H01L 25/50
2020/0118898 A1* 4/2020 Hu .......................... H01L 23/13
2020/0211945 A1* 7/2020 Huang .................... H01L 22/14
2020/0303314 A1* 9/2020 Kang ...................... H01L 24/20
2020/0312767 A1* 10/2020 Pietambaram .......... H01L 23/15
2020/0312770 A1* 10/2020 Lu ......................... H01L 21/563
2021/0327796 A1* 10/2021 Chen ................. H01L 23/49822
2022/0005793 A1* 1/2022 Kang ...................... H01L 25/50
2022/0037245 A1* 2/2022 Hu .................... H01L 23/49811
2022/0037294 A1* 2/2022 Hwang ............... H01L 21/6835
2022/0189880 A1* 6/2022 Pietambaram ...... H01L 23/5385
2022/0302009 A1* 9/2022 Wu ..................... H01L 21/6835
2022/0328388 A1* 10/2022 Hwang ............. H01L 23/49816
2023/0085411 A1 3/2023 Paital et al.
2023/0369191 A1* 11/2023 Ramakrishnan ............................ H01L 23/49838

* cited by examiner

HYBRID SUBSTRATES AND MANUFACTURING METHODS THEREOF

CROSS-REFERENCES TO RELATED APPLICATIONS

This application claims priority to U.S. Provisional Application No. 63/517,747, filed Aug. 4, 2023, which is commonly owned and incorporated by reference herein for all purposes.

FIELD OF INVENTION

The subject technology is directed to semiconductor devices and manufacturing methods.

BACKGROUND OF THE INVENTION

Over the past few decades, semiconductor packaging materials and processes have evolved. As high-performance computing and associated applications advance, there emerges a pressing need for substrates that can cater to heightened integration demands. Various approaches involve heterogeneous integration, which allows for the integration of different types of devices (e.g., silicon and/or memory components) on a single package. However, it remains a challenging task to ensure seamless communication, efficient high-density routing, and effective integration of both active and passive components onto the substrates.

Various approaches for enhanced substrates have been explored, but they have proven to be insufficient. It is important to recognize the need for new and improved substrates and their manufacturing processes.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
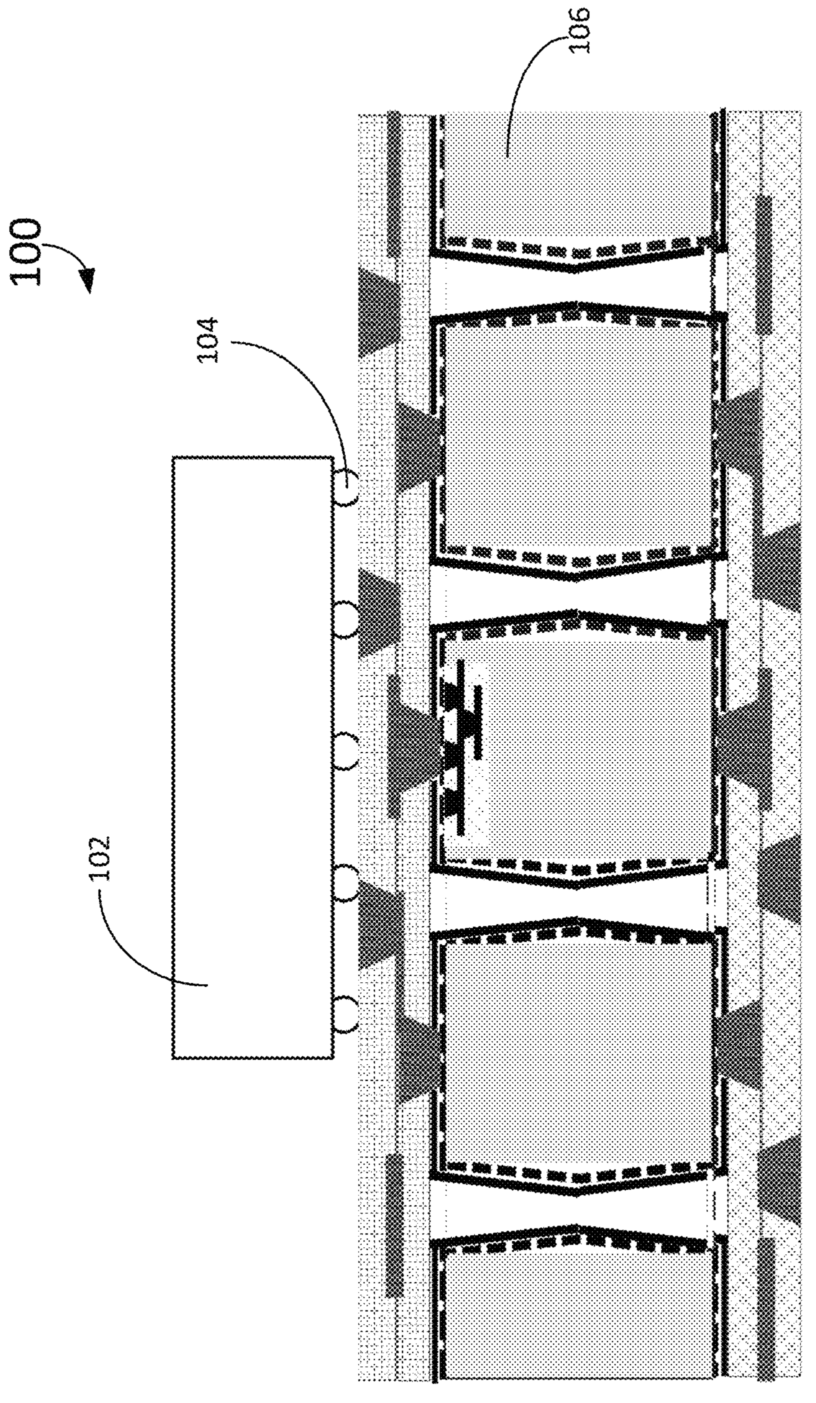
FIG. 1 is a simplified diagram illustrating a semiconductor device having a substrate according to the embodiments of the subject technology.

The subject technology is directed to semiconductor devices and manufacturing methods. In various embodiments, the subject technology provides a semiconductor device, which comprises a first circuit characterized by a first coefficient of thermal expansion (CTE) and a substrate characterized by a second CTE. A ratio of the first CTE to the second CTE is greater than or equal to 3:5, which ensures harmonious thermal behavior, leading to improved yield and reduced warpage. In some implementations, one or more circuit elements may be embedded in the substrate. There are other embodiments as well.

As previously noted, various methods for semiconductor fabrication have proven to be insufficient to meet the demands of high-computing applications. For example, some approaches involve using silicon interposers as substrates, which are constrained by the size of the reticle mask in lithography, facing limitations in size and complexity. Additionally, due to their rigidity and suboptimal thermal conductivity, interposers offer limited utility in co-packaging scenarios, such as integrating both active and passive components with computing and memory units.

On the other hand, various techniques involve using organic substrates to provide support and electrical connections to integrated circuit (IC) chips. However, a challenge arises from the significant difference in coefficients of thermal expansion (CTE) between the IC chip and the organic substrate. The term "coefficient of thermal expansion" may refer to a measure of how much a material expands or contracts when subjected to temperature changes. For instance, an IC chip—which is usually made of silicon—may have a CTE of less than 3 ppm/° C., while organic substrates may have higher CTE values ranging from 10 to 20 ppm/° C. Such CTE mismatch may lead to potential warpage and subsequent structural reliability challenges, such as cracks, delamination, or solder joint failures.

In various embodiments, the subject technology introduces systems and methods for producing hybrid substrates. For instance, the hybrid substrates may be characterized by an asymmetric configuration, which combines the interposer-like structure on one side with the organic substrate-like structures on the other side. By integrating the architectural features of silicon interposers and organic substrates, hybrid substrates advantageously address the challenges of reticle-limited interposers, the current state-of-the-art, allowing for high-density routing to meet the demands of high-performance applications. Additionally, with a CTE value closely matched to the silicon IC chip and an enhanced modulus, the substrates are more resistant to warpage during fabrication and deployment, leading to improved yield and reliability. Moreover, hybrid substrates are well-suited for co-packaging active and passive components with compute and memory devices for enhanced performance.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

When an element is referred to herein as being "disposed" in some manner relative to another element (e.g., disposed on, disposed between, disposed under, disposed adjacent to, or disposed in some other relative manner), it is to be understood that the elements can be directly disposed relative to the other element (e.g., disposed directly on another element), or have intervening elements present between the elements. In contrast, when an element is referred to as being "disposed directly" relative to another element, it should be understood that no intervening elements are present in the "direct" example. However, the existence of a direct disposition does not exclude other examples in which intervening elements may be present.

Similarly, when an element is referred to herein as being "bonded" to another element, it is to be understood that the elements can be directly bonded to the other element (without any intervening elements) or have intervening elements present between the bonded elements. In contrast, when an element is referred to as being "directly bonded" to another element, it should be understood that no intervening elements are present in the "direct" bond between the elements. However, the existence of direct bonding does not exclude other forms of bonding, in which intervening elements may be present.

Likewise, when an element is referred to herein as being a "layer," it is to be understood that the layer can be a single layer or include multiple layers. For example, a conductive layer may comprise multiple different conductive materials or multiple layers of different conductive materials, and a dielectric layer may comprise multiple dielectric materials or multiple layers of dielectric materials. When a layer is described as being coupled or connected to another layer, it is to be understood that the coupled or connected layers may include intervening elements present between the coupled or connected layers. In contrast, when a layer is referred to as being "directly" connected or coupled to another layer, it should be understood that no intervening elements are present between the layers. However, the existence of directly coupled or connected layers does not exclude other connections in which intervening elements may be present.

Moreover, the terms left, right, front, back, top, bottom, forward, reverse, clockwise and counterclockwise are used for purposes of explanation only and are not limited to any fixed direction or orientation. Rather, they are used merely to indicate relative locations and/or directions between various parts of an object and/or components.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." In this application, the use of the singular includes the plural unless specifically stated otherwise, and use of the terms "and" and "or" means "and/or" unless otherwise indicated. Moreover, the use of the terms "including" and "having," as well as other forms, such as "includes," "included," "has," "have," and "had," should be considered non-exclusive. Also, terms such as "element" or "component" encompass both elements and components comprising one unit and elements and components that comprise more than one unit, unless specifically stated otherwise.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items. By way of example, the phrases "at least one of A, B, and C" or "at least one of A, B, or C" each refer to only A, only B, or only C; and/or any combination of A, B, and C. In instances where it is intended that a selection be of "at least one of each of A, B, and C," or alternatively, "at least one of A, at least one of B, and at least one of C," it is expressly described as such.

One general aspect includes a semiconductor device, which comprise a first circuit comprising a silicon material, the first circuit being characterized by a first coefficient of thermal expansion. The semiconductor device further comprises a substrate coupled to the first circuit, the substrate being characterized by a second coefficient of thermal expansion. The substrate comprises a first layer coupled to the first circuit. The substrate further comprises a second layer coupled to the first layer, the second layer comprising a first wiring. The substrate further comprises a third layer coupled to the second layer, the third layer comprising a first via, the third layer being characterized by a third coefficient of thermal expansion, the third coefficient of thermal expansion being associated with the second coefficient of thermal expansion. The substrate further comprises a fourth layer coupled to the third layer, the fourth layer comprising a second wiring. A ratio of the first coefficient of thermal expansion to the second coefficient of thermal expansion is greater than or equal to 3:5.

Implementations may include one or more of the following features. The first layer comprises a passivation material. The second layer comprises a first dielectric material, and the first dielectric material comprises an organic material. The fourth layer comprises a second dielectric material, the second dielectric material comprises an inorganic material. The first wiring is coupled to the third layer and the second wiring is coupled to the third layer. The first circuit is coupled to the first layer via a first joint, the first layer comprises a first connection, and the first connection is coupled to the first joint. The first circuit comprises a memory, a thermal component, a mechanical component, an optical component, or an electrical component. The third layer comprises a glass material, a ceramic material, a diamond material, or a silicon material. The first wiring comprises a second via, the second via comprises a metal material. The second wiring comprises a third via, the third via comprises a metal material. The second coefficient of thermal expansion is less than 10 ppm/° C.

According to another embodiment, the subject technology provides a semiconductor device, which comprises a first circuit, the first circuit being characterized by a first coefficient of thermal expansion. The semiconductor device further comprises a substrate coupled to the first circuit, the substrate being characterized by a first thickness and a second coefficient of thermal expansion. The substrate comprises a first layer coupled to the first circuit. The substrate further comprises a second layer coupled to the first layer, the second layer comprising a first wiring, and the second layer being characterized by a second thickness. The substrate further comprises a third layer coupled to the second layer, the third layer comprising a first via, the third layer being characterized by a third thickness, and the third thickness being greater than the second thickness. The substrate further comprises a fourth layer coupled to the third layer, the fourth layer comprising a second wiring, the fourth layer being characterized by a fourth thickness, the third thickness being greater than the fourth thickness. The third thickness is greater than 60% of the first thickness.

Implementations may include one or more of the following features. The first circuit comprises a memory, a thermal component, a mechanical component, an optical component, or an electrical component. The third layer comprises a glass material, a ceramic material, a diamond material, or a silicon material. A ratio of the first coefficient of thermal expansion to the second coefficient of thermal expansion is greater than or equal to 3:5. The third layer further comprises a second circuit, and the second circuit comprises a memory, a thermal component, a mechanical component, an optical component, or an electrical component. The second coefficient of thermal expansion is less than 10 ppm/° C. The first wiring is coupled to the third layer. The second thickness is less than or equal to 30 um, and the fourth thickness is less than or equal to 30 um. The third thickness is greater than 100 um and less than 2000 um.

According to yet another embodiment, the subject technology provides a semiconductor device being formed by a process, which comprises providing a substrate, the substrate comprising a first side and a second side. The process further comprises providing a wafer coupled to the second side. The process further comprises forming a first via in the substrate. The process further comprises forming a first layer coupled to the first via. The process further comprises forming a second layer coupled to the first layer, the second layer comprising a metal material. The process further comprises forming a third layer coupled to the first side, the third layer comprising a first dielectric material. The process further comprises forming a first wiring in the third layer, the first wiring comprising a metal material. The process further comprises forming a fourth layer coupled to the first layer, the fourth layer comprising a first connection. The process further comprises detaching the wafer from the second side. In various embodiments, the process further comprises embedding a circuit in the substrate.

FIG. 1 is a simplified diagram illustrating a semiconductor device 100 having a substrate according to the embodiments of the subject technology. This diagram is merely an example, which should not unduly limit the scope of the claims. One of ordinary skill in the art would recognize many variations, alternatives, and modifications. As shown, semiconductor device 100 includes circuit 102 (e.g., a first circuit recited in claim 1). For example, circuit 102 may include an integrated circuit such as a microprocessor, memory chip, digital signal processor, system-on-chip (SoC), or the like.

Depending on the implementation, circuit 102 may include, without limitation, a memory, a thermal component, a mechanical component, an optical component, or an electrical component, active and passives devices, die stacks, etc. For instance, the term "memory" may refer to a device that can store data for immediate or future use. The memory may include, without limitation, a static random access memory (SRAM), a dynamic random access memory (DRAM), or Hybrid Bandwidth Memory (HBM), a voltage regulator, a capacitor, an inductor, or the like. The term "thermal component" may refer to a device that generates, transfers, or dissipates heat. The thermal component may include, without limitation, a heater, a heat sink, a thermoelectric generator, a thermal pad, or the like. The term "mechanical component" may refer to a device that contributes to the physical and structural integrity or movement functionalities within the semiconductor device. The mechanical components may include, without limitation, a microelectromechanical system (MEMS) device, an actuator, a sensor, an oscillator, or the like. The term "optical component may refer to a device that manages, generates, or detects light, including but not limited to devices that convert electrons to photons or vice versa or devices that generate or transmit laser. The optical components may include, without limitation, a lens, a waveguide, a photon modulator, a photonic integrated circuit, an II-V semiconductor, a light source, a light detector, or the like. The term "electrical component" may refer to a device that conducts, insulates, or switches electricity. Electrical components can be active or passive. The active electrical components may include, without limitation, a transistor, a diode, an integrated circuit, or the like. The passive electrical components may include, without limitation, a resistor, a capacitor, an inductor, or the like.

In various examples, circuit 102 may be characterized by a first coefficient of thermal expansion (CTE). The term "coefficient of thermal expansion" may refer to a measure of how much a material expands or contracts when subjected to temperature changes. CTE can be expressed in units of parts per million per degree Celsius (ppm/° C.). It can be measured using various methods, such as dilatometry, interferometry, thermomechanical analysis, strain gauges, Direct Image Correlation (DIC) or the like. It is to be appreciated that CTE is an important factor that affects the reliability and performance of semiconductor packages, as discrepancies in CTE values between adjoining materials can introduce thermal stress and deformation, leading to potential reliability problems. The CTE value of a material may be associated with various factors, such as material composition, microstructure, impurities, temperature range, or the like. In various embodiments, circuit 102 includes a silicon material and the first CTE can be modulated and in some cases may be less than 3 ppm/° C.

According to some embodiments, semiconductor device 100 further includes substrate 106 coupled to circuit 102. For instance, substrate 106 is coupled to circuit 102 through joint 104. The term "substrate" may refer to a material that provides support and electrical connections for electronic components. The substrate may also provide a means for connecting an IC chip (e.g., circuit 102) to the external circuitry (e.g., a PCB board). Substrate 106 may include, without limitation, one or more materials such as silicon, organic materials, ceramics, diamonds, or any combination thereof. The term "joint" may refer to an electrical or mechanical connection between the IC chip and the substrate. Joint 104 may include a solder-based joint (e.g., micro bumps) or a solderless joint (e.g., hybrid or direct copper bonds).

Depending on the implementation, substrate 106 may be a hybrid substrate. The term "hybrid" indicates that the substrate combines features and properties of multiple, distinct types of materials and/or structures. In some examples, substrate 106 includes a first structure (e.g., an interposer-like structure) located at a first side (e.g., a front side) and a second structure (e.g., an organic substrate-like structure) located at a second side (e.g., a backside). The first side may be opposite to the second side or vice versa. The first structure may provide a dense, electrically conductive network allowing for high-density routing, ensuring efficient communication across semiconductor device 100. In some cases, the first structure may possess the electrical and thermal properties of silicon, which ensures efficient signal transmission and heat dissipation. The second structure may be suited for the integration and co-packaging of both active and passive components, providing flexibility and adaptability for enhancing overall system performance.

In various implementations, substrate 106 may be characterized by a second CTE. For instance, a ratio of the first CTE to the second CTE is greater than or equal to 3:5. By closely matching the CTEs of substrate 106 and circuit 102, the risks associated with thermal stresses-such as warping or delamination—are significantly mitigated, enhancing both the reliability and longevity of semiconductor device 100. In some cases, substrate 106 may be coupled to other components (e.g., a printed circuit board) via mechanisms like solder balls, bumps, or the like.

Figure 2:
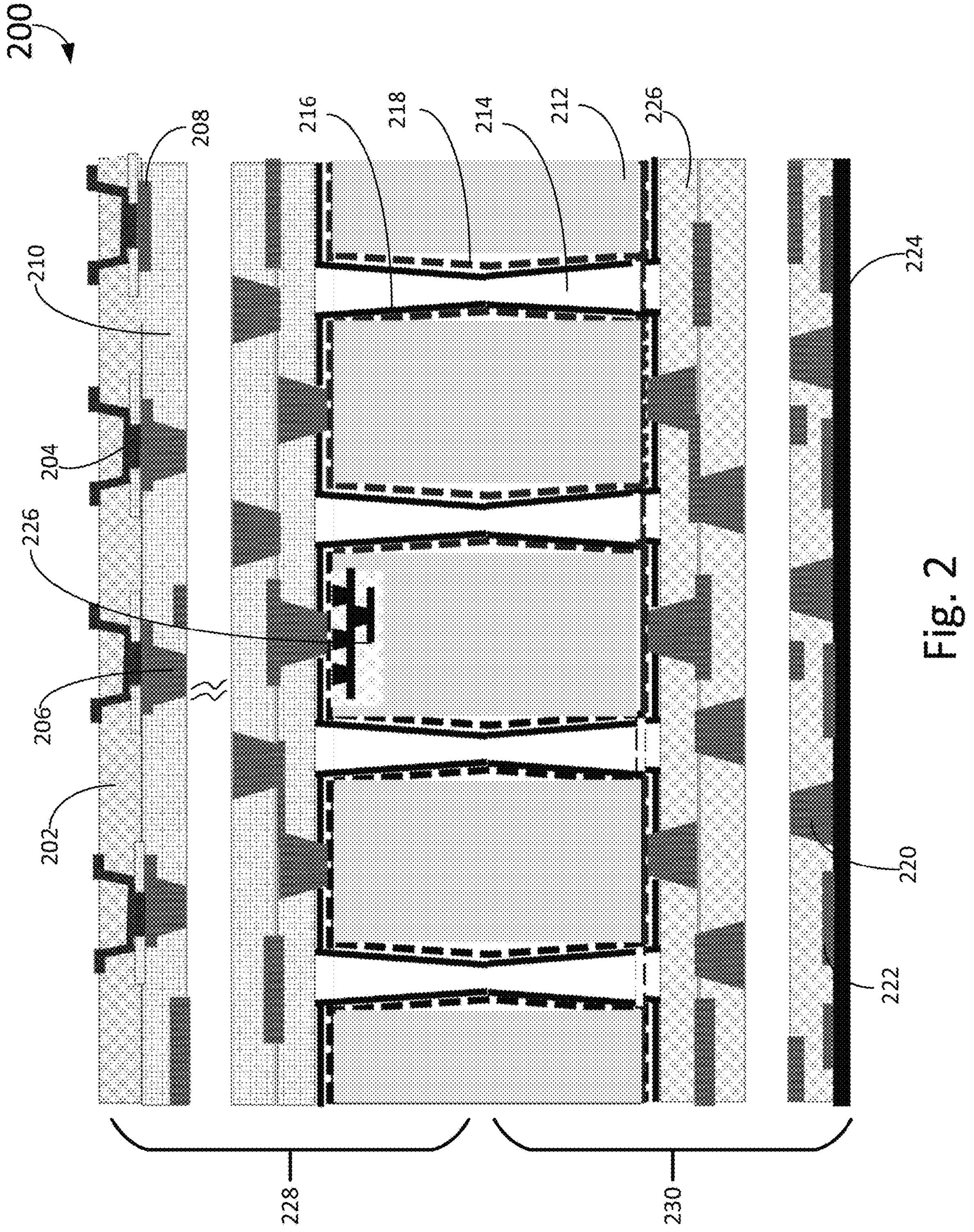
FIG. 2 is a simplified diagram illustrating a substrate of a semiconductor device according to the embodiments of the subject technology.

FIG. 2 is a simplified diagram illustrating a substrate 200 of a semiconductor device according to the embodiments of the subject technology. This diagram is merely an example, which should not unduly limit the scope of the claims. One of ordinary skill in the art would recognize many variations, alternatives, and modifications.

As shown, substrate 200 includes layer 202 (e.g., a first layer recited in claim 1). For instance, layer 202 may serve as a passivation layer. The term "passivation layer" may refer to a layer of material that is deposited on the surface of a semiconductor device to protect it from environmental factors (e.g., moisture, oxygen, contaminants, etc.). Layer 202 may include a passivation material, which may include, without limitation, one or more materials such as an organic material (e.g., polyimide, parylene, benzocyclobutene, etc.), an inorganic materials (e.g., silicon nitride, silicon dioxide, silicon carbide, etc.), or the like.

Depending on the implementation, layer 202 may be configured to couple to an external circuit (e.g., circuit 102 of FIG. 1). For instance, layer 202 may be coupled to the external circuit via a first joint (e.g., joint 104 of FIG. 1). Layer 202 may include a connection 204 (e.g., a first connection recited in claim 5). The term "connection" may refer to a mechanism or structure that enables electrical or physical linkage between different components (e.g., between the external circuit and layer 202). Connections may include, without limitation, ultra-fine pitch bumps (uBumps), hybrid copper bonding (HCB), wiring bonding, flip-chip bonding, or the like. For example, the term "uBump" or "ultra-fine pitch bump" may refer to a type of solder bump that has a very small diameter (e.g., less than 25 um) and pitch (e.g., less than 40 um) and may be used to connect an IC chip and a substrate in a semiconductor package. The term "hybrid copper bonding" may refer to a mechanism or structure configured to connect semiconductor dies or devices. Hybrid copper bonding may include bonding between copper or other metals (e.g., gold, etc.) and dielectric materials, which can be organic (e.g., small molecules or monomers, etc.) or inorganic (e.g., silicon oxide, other metal oxides, etc.).

In some embodiments, layer 210 (e.g., a second layer recited in claim 1) may be coupled to layer 202. For instance, layer 210 may include a dielectric layer. The term "dielectric layer" may refer to a non-conductive layer of material that is used to insulate different electrical components and pathways to ensure that electrical currents are directed as intended. Layer 210 may include a first dielectric material, which includes, without limitation, one or more materials such as an organic material (e.g., build-up film, polyimide, or other polymer-based dielectrics), an inorganic material (e.g., silicon nitride, silicon dioxide, silicon carbide, etc.), or the like. The composition, thickness, and number of dielectric layers can be tailored to meet specific requirements and may differ depending on the application.

In various implementations, layer 210 may include a first wiring. The first wiring may be coupled to layer 212. The term "wiring" may refer to electrically conductive pathways configured to facilitate electrical connections between components or regions in the semiconductor device. Wirings can be made using a variety of materials, such as copper, aluminum, gold, or the like. For instance, the first wiring may include a via 206 (e.g., a second via recited in claim 8), which may be filled with various materials including, without limitation, copper, aluminum, gold, or the like. In some cases, via 206 may be fabricated using copper plating. Depending on the implementation, a tapering ratio of via 206 can vary between 80% and 100%. For example, a tapering ratio of 80% may indicate that the diameter of the via at the top is 80% of the diameter of the via at the bottom. In some examples, the first wiring includes a conductive trace 208. The term "conductive trace" may refer to a strip of conductive material that is used to connect electrical components. Conductive traces may include, without limitation, one or more materials such as copper, aluminum, gold, or the like. The dimensions and configurations (e.g., width, length, or thickness) of conductive trace 208 may vary depending on the application.

According to some embodiments, layer 212 (e.g., a third layer recited in claim 1) may be coupled to layer 210. Layer 212 may include, without limitation, one or more materials such as glass, ceramic, diamond, silicon, or the like. For instance, layer 212 may include a via 214 (e.g., a first via recited in claim 1). The term "via" may refer to an opening or hole in a substrate that allows electrical connection between different layers of the substrate. Vias may include, without limitation, through silicon via (TSV), through glass vias (TGV), through ceramic vias (TCV), through diamond vias (TDV), or the like. Via 214 may be formed using various techniques including, without limitation, laser drilling, mechanical drilling, chemical etching, or the like. For instance, diameters of via 214 at opposite sides may be the same or different, depending on the drilling approach. In some cases, via 214 may be drilled from opposite sides (e.g., a top side and a bottom side) of layer 212, which may result in a tapered via. A tapering ratio of via 214—which may be defined as a difference between the top area and the middle or bottom area of the via—may be adjusted, depending on the specific application. For example, a tapering ratio of via 214 may range from 80% to 100%. In various examples, via 214 may be filled with a conductive material (e.g., copper, tungsten, titanium, aluminum, gold, silver, tin, nickel, lead, or the like) to ensure electrical conductivity and structural integrity.

In some embodiments, layer 212 further includes layer 216 coupled to via 214 and layer 218 coupled to layer 216. For instance, layer 218 may include a seed layer, which is configured to facilitate copper deposition to ensure optimal connectivity and conductivity within substrate 200. Layer 218 may include, without limitation, one or more materials such as titanium nitride, tungsten, silicon oxide, copper, or the like. Layer 216 may include a via-electroplated layer, which may be deposited on the walls of a via (e.g., via 214) by using an electrochemical process. Layer 216 may be configured to create a conductive path between different layers and to fill via 214 with metal materials. This can improve the electrical performance, reliability, and thermal management of the semiconductor device. Layer 216 may include, without limitation, one or more materials such as copper, organic resin, or the like. In some cases, layer 212 further comprises a circuit 226 (e.g., a second circuit recited in claim 14). Circuit 226 may include active and/or passive components, which may be embedded within substrate (e.g., layer 212) to enhance signal integrity and overall performance of the semiconductor device. For instance, circuit 226 may include, without limitation, a memory, a thermal component, a mechanical component, an optical component, an electrical component, or the like.

In various examples, layer 226 (e.g., a fourth layer recited in claim 1) may be coupled to layer 212. For instance, layer 226 may include a dielectric layer. Layer 210 may include a second dielectric material, which includes, without limitation, one or more materials such as an organic material (e.g., build-up film, polyimide, or other polymer-based dielectrics), an inorganic material (e.g., silicon nitride, silicon dioxide, silicon carbide, etc.), or the like. The composition, thickness, and number of dielectric layers can be tailored to meet specific requirements and may differ depending on the application.

In various implementations, layer 226 may include a second wiring. The second wiring may be coupled to layer 212. For instance, the second wiring may include a via 220 (e.g., a second via recited in claim 8), which may be filled with various materials including, without limitation, copper, aluminum, gold, or the like. Via 220 may be fabricated using copper plating. Depending on the implementation, a tapering ratio of via 220 can vary between 80% and 100%. In some examples, the second wiring includes a conductive trace 222. Conductive traces may include, without limitation, one or more materials such as copper, aluminum, gold, or the like. The dimensions and configurations (e.g., width, length, or thickness) of conductive trace 222 may vary depending on the application. In some embodiments, layer 226 may be coupled to layer 224, which may include a solder resist material. The term "solder resist material" may refer to a layer of material that is applied to the surface of printed circuit boards (PCBs) and semiconductor packages to protect the circuit pattern from solder and other contaminants. Solder resist materials may include, without limitation, one or more materials such as epoxy resin, acrylate resin, polyimide resin, or the like.

As previously noted, it is advantageous to closely match the CTE values of substrate 200 and the external circuit (e.g., circuit 102 of FIG. 2) to mitigate risks associated with thermal expansion mismatches, which can lead to thermal stress and structural challenges like delamination and warpage. In various implementations, layer 212 plays an important role in configuring the thermal expansion characteristics (e.g., CTE) of substrate 200. For instance, due to its thickness and material composition, layer 212 has a dominant effect on the substrate's thermal expansion behavior. In some examples, layer 212 accounts for more than 60% of the total thickness of substrate 200, making it the primary determinant of the substrate's CTE (e.g., the second CTE). For example, substrate 200 may be characterized by a first thickness, layer 210 may be characterized by a second thickness, and layer 212 may be characterized by a third thickness. The third thickness may be greater than 60% of the first thickness. Accordingly, a CTE value (e.g., a third CTE recited in claim 1) of layer 212 may be associated with the second CTE. In some cases, the third thickness is greater than 100 um and less than 2000 um. The second thickness may be less than or equal to 30 um. Layer 226 may be characterized by a fourth thickness, which may be less than or equal to 30 um.

In various embodiments, substrate 200 may be characterized by an asymmetrical configuration. The term "asymmetrical" indicates that different sections or regions of substrate 200 have distinct properties or configurations. In various examples, first region 228 and second region 230 are positioned at opposite sides of substrate 200. First region 228 may be characterized by features associated with silicon interposers. For example, first region 228 provides fine-pitched electrical interconnects, which enable high-density routing and efficient connections across the semiconductor device. Second region 230 may be characterized by features associated with organic substrates. For instance, second region 230 provides flexibility and enhanced thermal management capabilities, allowing for seamless integration of both passive and active components. Such a configuration improves CTE matching by strategically combining the rigidity of a silicon-rich region and the flexibility of an organic-rich region, which collectively minimize thermal stresses and mitigate risks like delamination and warping. The asymmetrical configuration ensures high-density electrical interconnections and optimal thermal management while aligning seamlessly with existing assembly processes. For instance, the fabrication of substrate 200 may be achieved by masking one side, processing the other, and then repeating a similar process on the other side.

Figure 3:
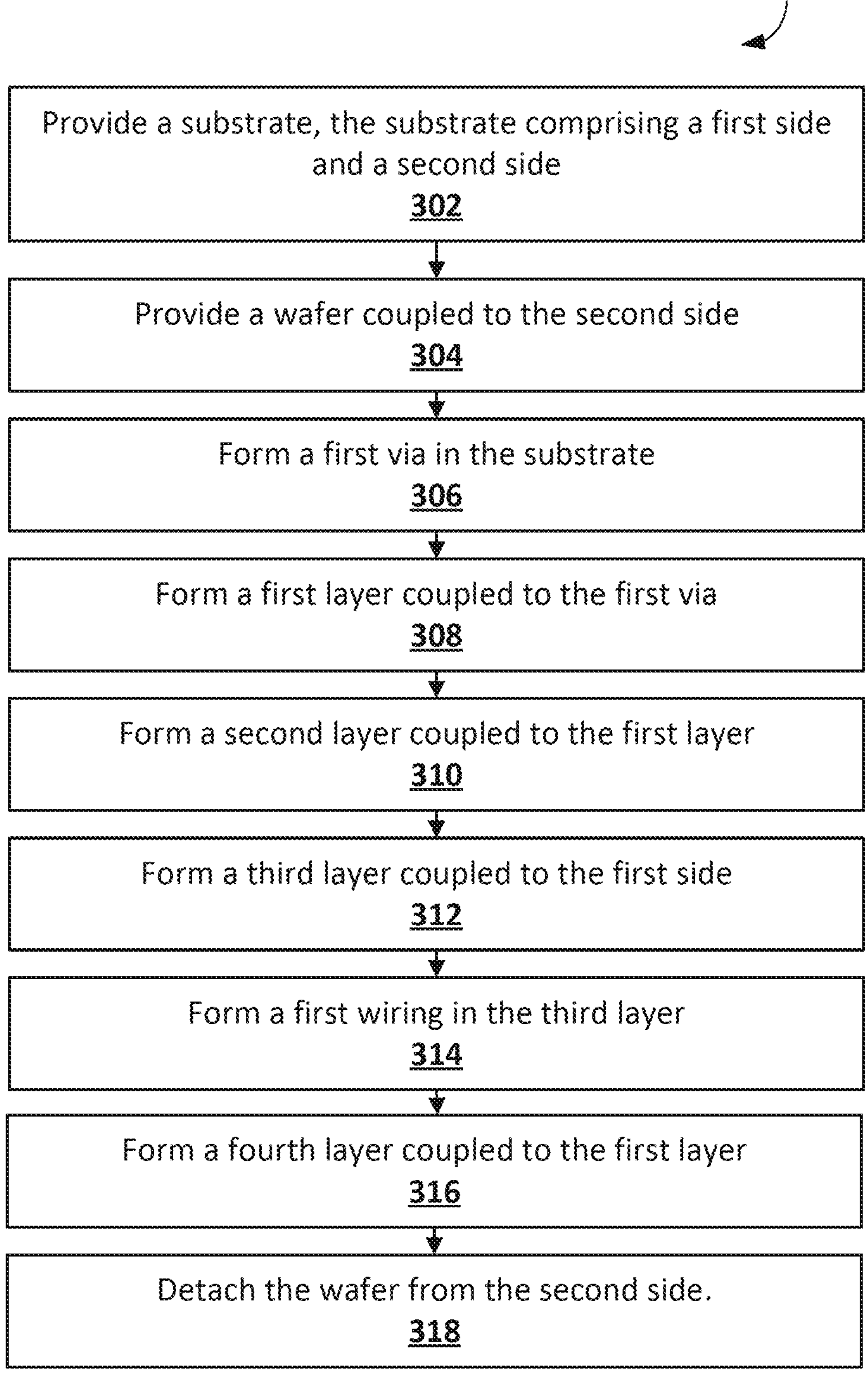
FIG. 3 is a flow diagram illustrating a method for manufacturing a substrate of a semiconductor device according to the embodiments of the subject technology.

FIG. 3 is a flow diagram illustrating a method 300 for manufacturing a substrate of a semiconductor device according to the embodiments of the subject technology. This diagram is merely an example, which should not unduly limit the scope of the claims. One of ordinary skill in the art would recognize many variations, alternatives, and modifications. For example, one or more steps may be added, removed, repeated, modified, replaced, overlapped, and/or rearranged, and should not limit the scope of the claims.

In some embodiments, method 300 includes step 302 of providing a substrate, which includes a first side and a second side. For instance, the first side and the second side may be opposite to each other. Referring to substrate 200 of FIG. 2, the first side may include a top portion or a front side of the substrate and the second side may include a bottom portion or a back side of the substrate. The substrate may include, without limitation, one or more materials such as glass, ceramic, diamond, silicon, or the like.

In step 304, method 300 includes providing a wafer coupled to the second side. The wafer may be a carrier wafer. The term "carrier" or "carrier wafer" may refer to a material or device that holds and protects the semiconductor package during processing, storage, or transport. There are different types of wafers depending on the packaging technology and application. For example, the wafer may include one or more materials such as organic material, core material, glass material, and/or others. Depending on the particular application, the wafer may possess attributes such as heat dissipation capabilities, identification codes, alignment marks, or other features. For example, the wafer may be engineered to provide structural rigidity and support for the formation and processing of semiconductor substrates.

In step 306, method 300 includes forming a first via in the substrate. The first via may include, without limitation, through silicon via (TSV), through glass vias (TGV), through ceramic vias (TCV), through diamond vias (TDV), or the like. Depending on the implementation, the first via may be formed using one or more techniques such as laser drilling, mechanical drilling, chemical etching, or the like. In various examples, the first via may be filled with a conductive material (e.g., copper, tungsten, titanium, aluminum, gold, silver, tin, nickel, lead, or the like) to ensure electrical conductivity and structural integrity.

In step 308, method 300 includes forming a first layer coupled to the first via. For instance, the first layer may include a seed layer, which is configured to facilitate copper deposition to ensure optimal connectivity and conductivity within the substrate. The first layer may include, without limitation, one or more materials such as titanium nitride, tungsten, silicon oxide, copper, or the like.

In step 310, method 300 includes forming a second layer coupled to the first layer. In some cases, the second layer comprises a metal material. The second layer may include a via-electroplated layer, which may be deposited on the walls of a via (e.g., the first via) by using an electrochemical process. The second layer may be configured to create a conductive path between different layers and to fill the first via with metal materials. The second layer may include, without limitation, one or more materials such as copper, organic resin, or the like.

In step 312, method 300 includes forming a third layer coupled to the first side. The third layer may include a first dielectric material, which may include, without limitation, one or more materials such as organic materials (e.g., build-up film, polyimide, or other polymer-based dielectrics), inorganic materials (e.g., silicon nitride, silicon dioxide, silicon carbide, etc.), or the like.

In step 314, method 300 includes forming a first wiring in the third layer. For example, the first wiring includes a metal material. The first wiring may be made using a variety of materials, such as copper, aluminum, gold, or the like. For instance, the first wiring may include one or more conductive pads, conductive traces, conductive vias, conductive micro bumps, conductive solder balls, conductive posts or pillars, and/or other suitable connectors or interconnects.

In step 316, method 300 includes forming a fourth layer coupled to the first layer. The fourth layer includes a first connection. The first connection may be configured to establish an electrical or physical linkage between the substrate and an IC chip. The first connection may include, without limitation, ultra-fine pitch bumps, hybrid copper bonding, wiring bonding, flip-chip bonding, or the like. In step 318, method 300 includes detaching the wafer from the second side. In various implementations, method 300 further includes embedding a circuit in the substrate. The circuit may include active and/or passive components, which may be configured to enhance signal integrity and overall performance of the semiconductor device. For instance, the circuit may include, without limitation, a memory, a thermal component, a mechanical component, an optical component, an electrical component, or the like.

While the above is a full description of the specific embodiments, various modifications, alternative constructions, and equivalents may be used. Therefore, the above description and illustrations should not be taken as limiting the scope of the present invention which is defined by the appended claims.

What is claimed is:

1. A semiconductor device, comprising:

a first circuit comprising a silicon material, the first circuit being characterized by a first coefficient of thermal expansion;

a substrate coupled to the first circuit, the substrate being characterized by a second coefficient of thermal expansion, the substrate comprising:

a first layer coupled to the first circuit;

a second layer coupled to the first layer, the second layer comprising a first wiring;

a third layer coupled to the second layer, the third layer comprising a first via, the third layer being characterized by a third coefficient of thermal expansion, the third coefficient of thermal expansion being associated with the second coefficient of thermal expansion, the third layer comprising a first via having a taper profile for the first wiring, the first via being drilled from opposite sides of the third layer; and a fourth layer coupled to the third layer, the fourth layer comprising a second wiring;

wherein a ratio of the first coefficient of thermal expansion to the second coefficient of thermal expansion is greater than or equal to 3:5.

2. The semiconductor device of claim 1, wherein the first layer comprises a passivation material.

3. The semiconductor device of claim 1, wherein:

the second layer comprises a first dielectric material, and the first dielectric material comprises an organic material; and the fourth layer comprises a second dielectric material, the second dielectric material comprises an inorganic material.

4. The semiconductor device of claim 1, wherein the first wiring is coupled to the third layer and the second wiring is coupled to the third layer.

5. The semiconductor device of claim 1, wherein the first circuit is coupled to the first layer via a first joint, the first layer comprises a first connection, and the first connection is coupled to the first joint.

6. The semiconductor device of claim 1, wherein the first circuit comprises a memory, a thermal component, a mechanical component, an optical component, or an electrical component.

7. The semiconductor device of claim 1, wherein the third layer comprises a glass material, a ceramic material, a diamond material, or a silicon material.

8. The semiconductor device of claim 1, wherein:

the first wiring comprises a second via, the second via comprises a metal material; and the second wiring comprises a third via, the third via comprises a metal material.

9. The semiconductor device of claim 1, wherein the second coefficient of thermal expansion is less than 10 ppm/° C.

10. A semiconductor device, comprising:

a first circuit, the first circuit being characterized by a first coefficient of thermal expansion;

a substrate coupled to the first circuit, the substrate being characterized by a first thickness and a second coefficient of thermal expansion, the substrate comprising:

a first layer coupled to the first circuit;

a second layer coupled to the first layer, the second layer comprising a first wiring, and the second layer being characterized by a second thickness;

a third layer coupled to the second layer, the third layer comprising a first via, the third layer being characterized by a third thickness, and the third thickness being greater than the second thickness, the third layer comprising a first via having a taper profile for the first wiring, the first via being drilled from opposite sides of the third layer; and a fourth layer coupled to the third layer, the fourth layer comprising a second wiring, the fourth layer being characterized by a fourth thickness, the third thickness being greater than the fourth thickness;

wherein the third thickness is greater than 60% of the first thickness.

11. The semiconductor device of claim 10, wherein the first circuit comprises a memory, a thermal component, a mechanical component, an optical component, or an electrical component.

12. The semiconductor device of claim 10, wherein the third layer comprises a glass material, a ceramic material, a diamond material, or a silicon material.

13. The semiconductor device of claim 12, wherein a ratio of the first coefficient of thermal expansion to the second coefficient of thermal expansion is greater than or equal to 3:5.

14. The semiconductor device of claim 10, wherein the third layer further comprises a second circuit, and the second circuit comprises a memory, a thermal component, a mechanical component, an optical component, or an electrical component.

15. The semiconductor device of claim 10, wherein the second coefficient of thermal expansion is less than 10 ppm/° C.

16. The semiconductor device of claim 10, wherein the first wiring is coupled to the third layer.

17. The semiconductor device of claim 10, wherein the second thickness is less than or equal to 30 μm, and the fourth thickness is less than or equal to 30 um.

18. The semiconductor device of claim 10, wherein the third thickness is greater than 100 μm and less than 2000 um.

19. A semiconductor device being formed by a process, the process comprising:

providing a substrate, the substrate comprising a first side and a second side;

providing a wafer coupled to the second side;

forming a first via in the substrate;

forming a first layer coupled to the first via;

forming a second layer coupled to the first layer, the second layer comprising a metal material;

forming a third layer coupled to the first side, the third layer comprising a first dielectric material;

forming a first wiring in the third layer, the first wiring comprising a metal material;

forming a fourth layer coupled to the first layer, the fourth layer comprising a first connection; and detaching the wafer from the second side;

wherein the third layer comprises a first via having a taper profile for the first wiring, the first via being drilled from opposite sides of the third layer.

20. The semiconductor device of claim 19, wherein the process further comprising embedding a circuit in the substrate.

* * * * *